United States Patent
Galyean

(10) Patent No.: US 6,984,915 B2
(45) Date of Patent: Jan. 10, 2006

(54) ELECTRICAL SLIP RING PLATTER MULTILAYER PRINTED CIRCUIT BOARD AND METHOD FOR MAKING SAME

(75) Inventor: Jack T. Galyean, Galax, VA (US)

(73) Assignee: Electro-Tec Corp., Blacksburg, VA (US)

( * ) Notice: Subject to any disclaimer, the term of this patent is extended or adjusted under 35 U.S.C. 154(b) by 262 days.

(21) Appl. No.: 10/348,788

(22) Filed: Jan. 22, 2003

(65) Prior Publication Data

US 2003/0135981 A1 Jul. 24, 2003

Related U.S. Application Data

(60) Provisional application No. 60/350,805, filed on Jan. 22, 2002.

(51) Int. Cl.
*H01R 39/08* (2006.01)

(52) U.S. Cl. .......................................... 310/232; 29/597
(58) Field of Classification Search ................. 310/232, 310/237; 29/597
See application file for complete search history.

(56) References Cited

U.S. PATENT DOCUMENTS

| | | | |
|---|---|---|---|
| 2,696,570 A | 12/1954 | Pandapas | |
| 2,703,868 A | 3/1955 | Rausenberger | |
| 3,038,138 A | 6/1962 | Peterson | |
| 3,066,386 A | 12/1962 | Filipczak | |
| 3,603,823 A | 9/1971 | Mason | |
| 4,131,516 A | 12/1978 | Bakos et al. | |
| 4,411,982 A | 10/1983 | Shibuya et al. | |
| 4,510,276 A | 4/1985 | Leech et al. | |
| 4,871,935 A * | 10/1989 | Sweet et al. ............... 310/232 | |
| 4,878,294 A | 11/1989 | Dugan et al. | |
| 5,054,189 A | 10/1991 | Bowman et al. | |
| 5,617,629 A | 4/1997 | Ekström | |
| 5,690,498 A | 11/1997 | Sobhani | |
| 5,690,837 A | 11/1997 | Nakaso et al. | |
| 5,699,613 A | 12/1997 | Chong et al. | |
| 5,734,218 A | 3/1998 | Crockett et al. | |
| 5,745,976 A | 5/1998 | Crockett et al. | |
| 5,805,115 A | 9/1998 | Pellerin et al. | |
| 5,891,606 A | 4/1999 | Brown | |
| 5,901,429 A | 5/1999 | Crockett | |
| 6,162,365 A | 12/2000 | Bhatt et al. | |
| 6,222,297 B1 * | 4/2001 | Perdue ...................... 310/232 | |
| 6,240,636 B1 | 6/2001 | Asai et al. | |
| 6,356,002 B1 | 3/2002 | Witherspoon et al. | |
| 6,502,298 B1 | 1/2003 | Witherspoon et al. | |

FOREIGN PATENT DOCUMENTS

| | | |
|---|---|---|
| DE | 319390 | 12/1974 |
| EP | 911918 A2 * | 4/1998 |

OTHER PUBLICATIONS

U.S. Appl. No. US 2001/004176 A1, Jun. 21, 2001, to Perdue.

* cited by examiner

*Primary Examiner*—Burton Mullins
(74) *Attorney, Agent, or Firm*—Price, Heneveld, Cooper, DeWitt & Litton, LLP

(57) ABSTRACT

A slip ring and a method for manufacturing a slip ring utilizes a first double clad copper laminate with a first side and a second side separated by a first dielectric and a second double clad copper laminate with a third side and a fourth side separated by a second dielectric. Copper is selectively removed from the second and third sides to provide desired patterns in the copper. The second and third sides are joined in a desired orientation. Substantially, all of the copper from a window in the first and fourth sides is removed to expose the first and second dielectrics. A plurality of concentric grooves is machined into the first and second dielectrics from the first and fourth sides and the concentric grooves are metalized to provide a plurality of concentric metalized rings.

33 Claims, 12 Drawing Sheets

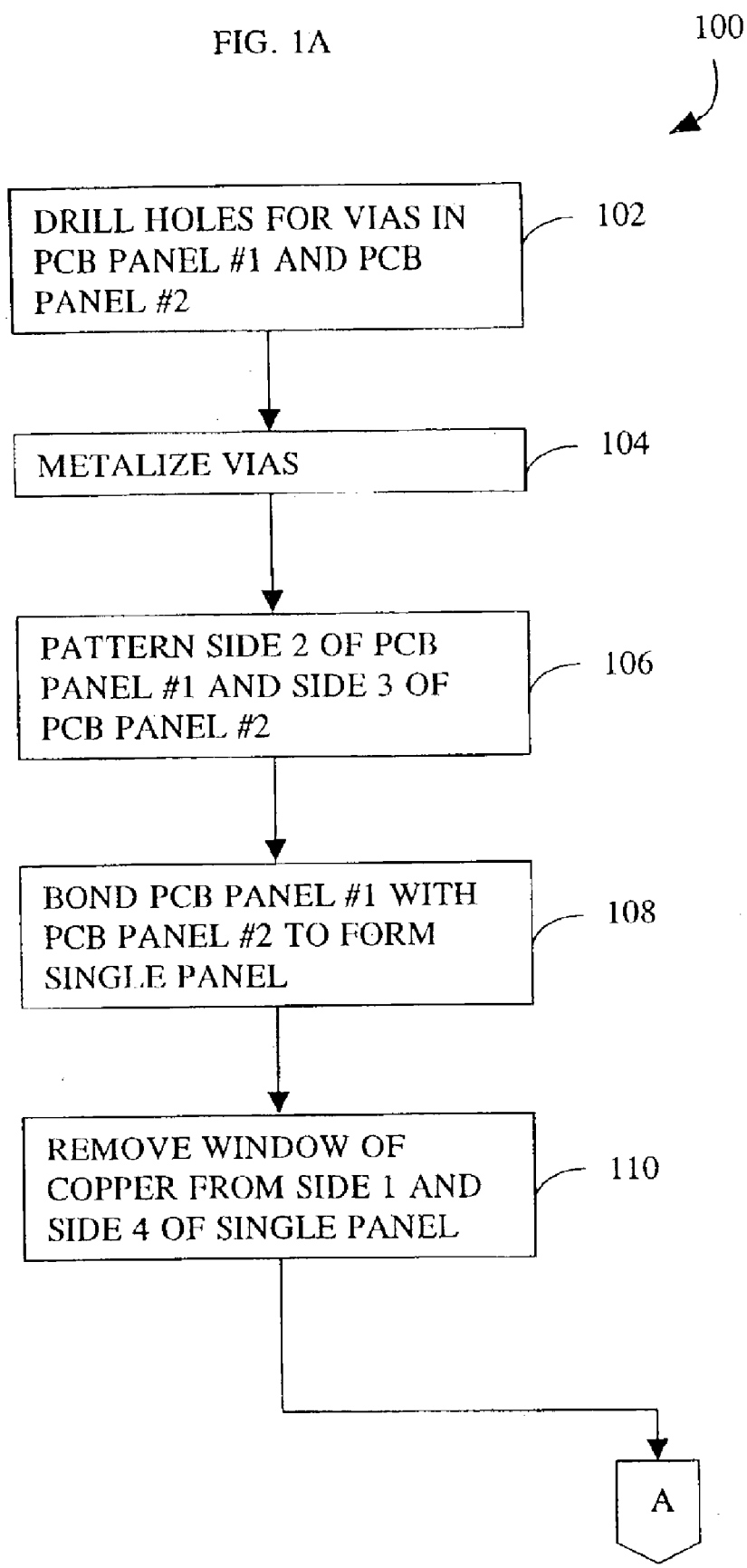

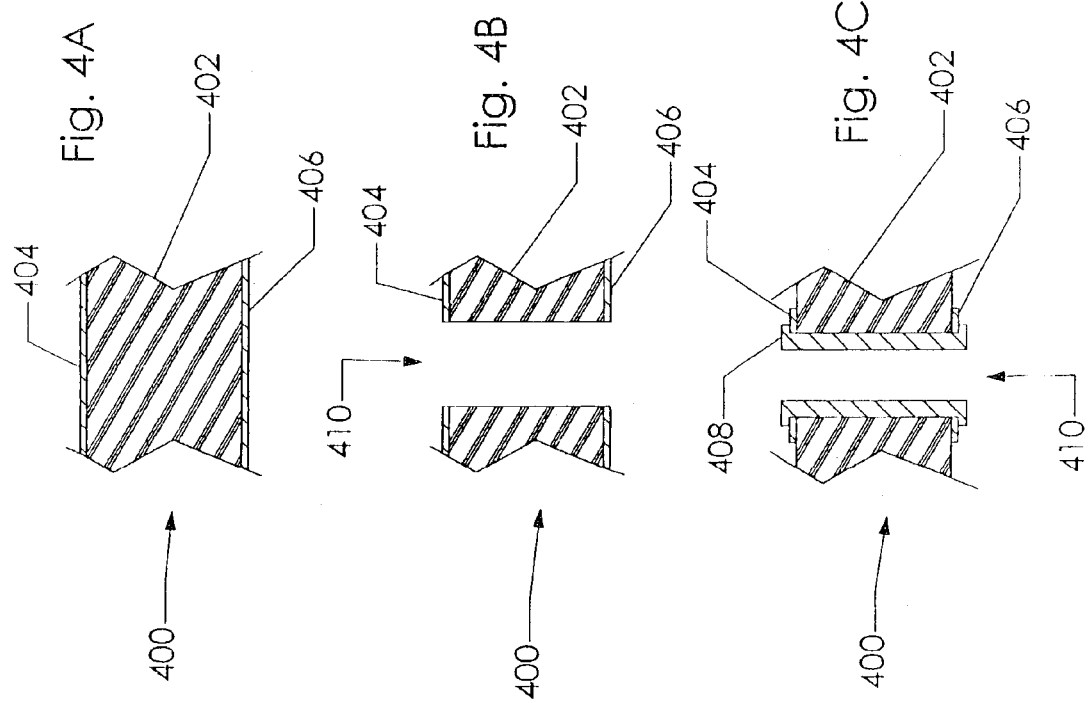

ELECTRICAL SLIP RING PLATTER MULTILAYER PRINTED CIRCUIT BOARD AND METHOD FOR MAKING SAME

This application claims the benefit of the filing date of U.S. Provisional Patent Application Ser. No. 60/350,805 entitled, "ELECTRICAL SLIP RING PLATTER PRINTED CIRCUIT BOARD AND METHOD FOR MAKING SAME," by Jack Galyean, filed Jan. 22, 2002, the entire disclosure of which is hereby incorporated by reference.

FIELD OF THE INVENTION

The present invention is generally directed to a multilayer printed circuit board (PCB) and, more specifically, to an electrical slip ring platter multilayer PCB and a method of manufacturing the electrical slip ring platter multilayer PCB.

BACKGROUND OF THE INVENTION

Electrical slip ring platters are well-known devices used to electrically connect a rotating unit to a stationary unit where a typical cable or other wiring is not functional or less efficient for providing an electrical interface between the rotating and stationary unit. Typical platter or pancake-style slip rings consist of a rotating platter with multiple circular conductive traces and a stationary brush block that includes "brushes" of various designs that ride on or in a groove formed in the conductive traces to electrically connect the rotating platter to the stationary brush block.

Historically, "platter" slip rings have been designed for minimal height or thickness and have been used for both military and commercial applications with tight space requirements. Single or multiple concentric conductive rings forming the slip ring base have generally been formed from materials having a thickness within a range of 0.002 to 0.040 inches. Characteristically, the conductive rings for such slip ring bases have been spaced within a range of approximately 0.10 to 0.060 inches. A variety of different insulation and base materials have been used to create the platters, e.g., cast epoxy.

A grooved plate process is one common method of manufacturing pancake slip rings. In a typical grooved plate process, a grooved plate is prepared by rough machining a brass plate to approximately a "grooved plate" shape. The grooved plate is then annealed to minimize distortion during subsequent plastic curing and final machining. One side of the grooved plate is then machined to a final "grooved plate" shape. Peaks correspond to the bottom of the future rings, and valleys correspond to the future insulation barriers between rings. The "grooved plate" is then plated with nickel and a gold strike. A lead wire is then soldered or welded to individual ring features on the grooved plate. A glass cloth is then bonded to the plate to prevent the leads from entering the valleys of the plate (the fixture barriers between rings).

The plate and lead assembly is then loaded into a mold, which contains features to provide for internal lead routing, lead exit positioning and other rotor geometry requirements. The mold is vacuum cast with liquid epoxy to completely fill the internal detail of the mold. At this point, the assembly or rotor is a single piece with a continuous plate on one or two sides with internal epoxy insulation. The final machining step turns the exposed surface of the plate to separate the plate into individual concentric rings separated from each other with epoxy (filling the former valleys in the plate). In this process, after the rings are separated, insulating barriers between the rings are machined to final dimensions. In addition, at this step, the ring surface is machined to a final dimension. The ring groove patterns have taken various forms, e.g., V, U or double-V shaped, and the rings have typically been machined to achieve a desired surface roughness. The rotor is then nickel plated and then plated with a precious metal (usually gold or silver). It should be appreciated that this process is fairly complex and the density of the slip rings is limited by the machining requirements.

An electroformed ring process is another known process. A rotor and lead assembly is prepared by loading lead wires into a mold, which contains features to provide for internal lead routing, lead exit positioning and other rotor geometry requirements. The mold is then cast with a liquid epoxy to completely fill the internal detail of the mold and encapsulate the lead wires. Next, starter rings are prepared as follows. At the bottom of the ring groove, the lead wire conductor is exposed and prepared (generally by applying a fillet of conductive epoxy). The inside walls of the ring groove are coated with conductive plastic to form a continuous conductive starter ring for plating. The ring is electroformed by plating copper onto the starter ring using, for example, a high-build plating technology. High-build plating technology or high-build-up electroforming is a method of creating a thicker ring cross-section by plating up the starter ring, usually in a copper bath. The starter rings may be plated up with or without dielectric barriers between the rings. At this point, the assembly forms a single piece with discrete rings and leads embedded in epoxy insulation. The final machining step forms the final shape and texture of the rings and insulating barriers between the rings. The rings of the assembly are then nickel plated and then plated with precious metal (usually gold or silver).

A disadvantage of the electroformed rings process is that ring thickness is limited unless barriers are present during build-up of the rings. Further, extensive machining is typically required to create dielectric barriers to allow a build-up of the rings. Due to the lengthy times required to electroform the rings, plating solution can damage the slip ring materials, leak into leads embedded in the dielectric causing lead damage and electrical insulation failures. Dielectric materials can also interfere with the electroforming process. Additionally, the sides of the rings cannot be sealed with nickel, thus, allowing corrosion products to form and contaminate the electrical contacts. These contaminants can lead to contact failure and electrical shorts.

Another known process has used double sided printed circuit board (PCB) processes to build-up thick copper on top of a copper laminate foil (e.g., 0.13 inches thick) and formed grooves into the build-up copper by either controlled depth chemical etching a "U" groove or machining a "V" groove in the copper. However, with this process the ring copper heights that can be achieved, due to the PCB expose and related plating processes, and the depth of any groove formed in the rings is limited. Further, known plating times for such a process may approach 12 to 15 hours and typical maximum groove depths achievable with this process are within the range of 0.008 to 0.010 inches. Additionally, with this process there is no PCB dielectric base material barrier between the conductive trace rings and if a dielectric barrier is required, additional non-PCB base dielectric materials and processes are required.

In this process, the surface plating of precious metals, such as gold, requires forming multiple electrical contact points for each individual conductive ring on each platter PCB after individual conductive rings are routed out of a PCB manufacturing panel, which is labor intensive. Via holes are then filled with relatively expensive silver conductive epoxy using a manual operation, which is also labor intensive. When two platter PCBs are bonded together after ring groove operations, it is also difficult to adhere to a tight tolerance (0.001 to 0.004 inch) front to back conductive ring groove registration/concentricity requirement, which is highly preferable in high-density slip rings.

Some of the most recent requirements using an electrical slip ring assembly have severe space requirements with high circuit density that cannot readily be achieved by either the grooved plate process or the electroformed ring process. The above PCB processing method does not allow for PCB base material dielectric barriers or precious metal plating at the PCB manufacturing panel stage, which is desirable in many high circuit density design applications. This process also uses conductive electrical epoxy to fill holes and is currently limited to double-sided PCB designs.

What is needed is an electrical slip ring platter and a method of manufacturing the electrical slip ring platter that addresses the above-referenced problems, while providing an readily producible, economical electrical slip ring platter.

SUMMARY OF THE INVENTION

The present invention is directed to a slip ring and a method for manufacturing a slip ring. The method for manufacturing the slip ring may start with the procurement of a first double clad copper laminate and a second double clad copper laminate. The first double clad copper laminate has a first side and a second side separated by a first dielectric. The second double clad copper laminate has a third side and a fourth side separated by a second dielectric. Initially, copper is selectively removed from the second and third sides to provide desired patterns in the copper. Next, the second and third sides are joined in a desired orientation. Then, substantially all of the copper from a window in the first and fourth sides is removed to expose the first and second dielectrics. Next, a plurality of concentric grooves is machined into the first and second dielectrics from the first and fourth sides and, finally, the concentric grooves are metalized to provide a plurality of concentric metalized rings.

These and other features, advantages and objects of the present invention will be further understood and appreciated by those skilled in the art by reference to the following specification, claims and appended drawings.

BRIEF DESCRIPTION OF THE DRAWINGS

FIGS. 1A–1D depict a flow chart detailing an exemplary process for manufacturing a multi-layer printed circuit board (PCB) slip ring, according to an embodiment of the present invention;

FIGS. 4A–4C are partial cross-sectional views a double clad copper laminate including plated through holes, according to an embodiment of the present invention;

DETAILED DESCRIPTION OF PREFERRED EMBODIMENTS

Figure 1B:
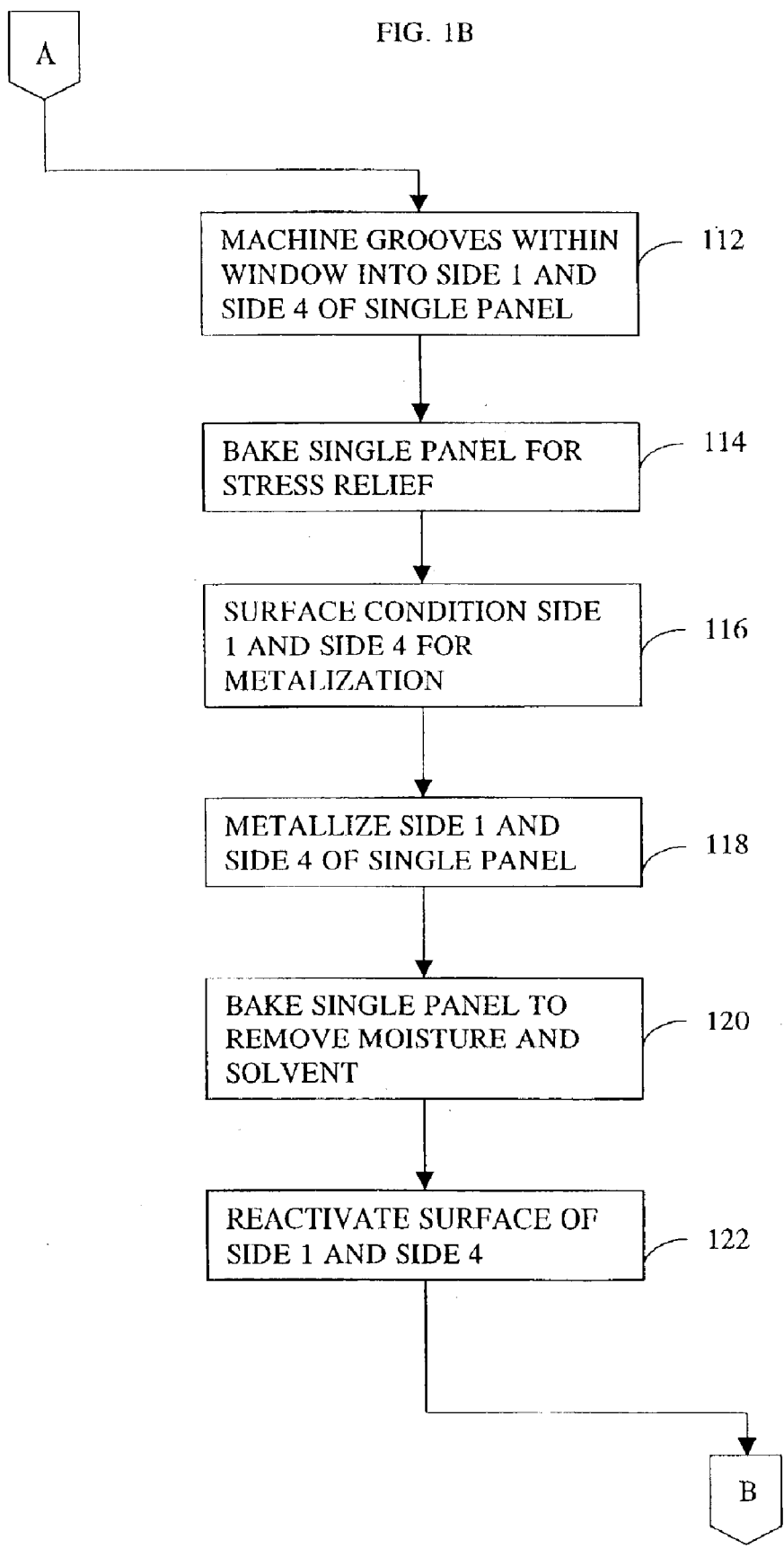
Figure 1C:
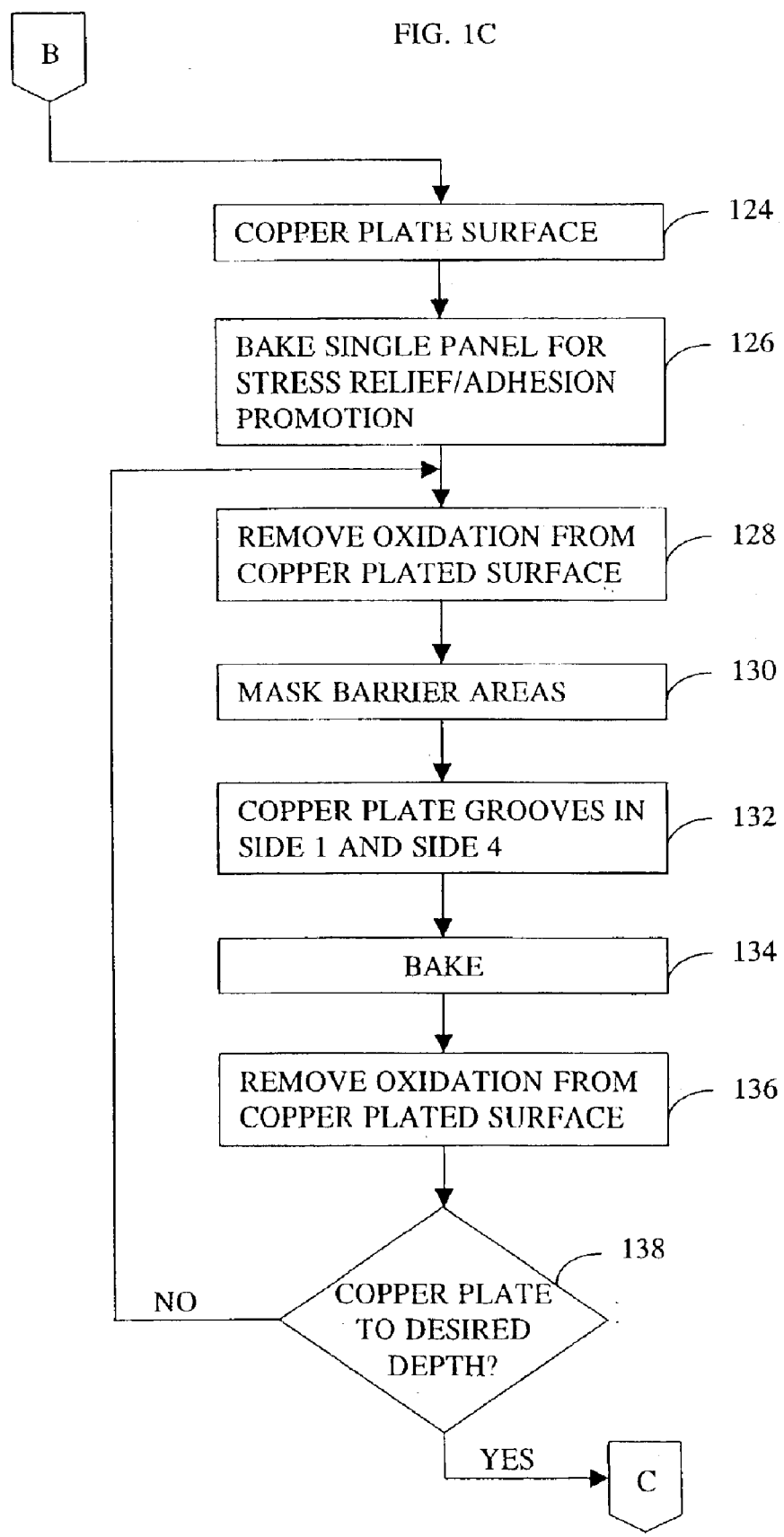
Figure 1D:
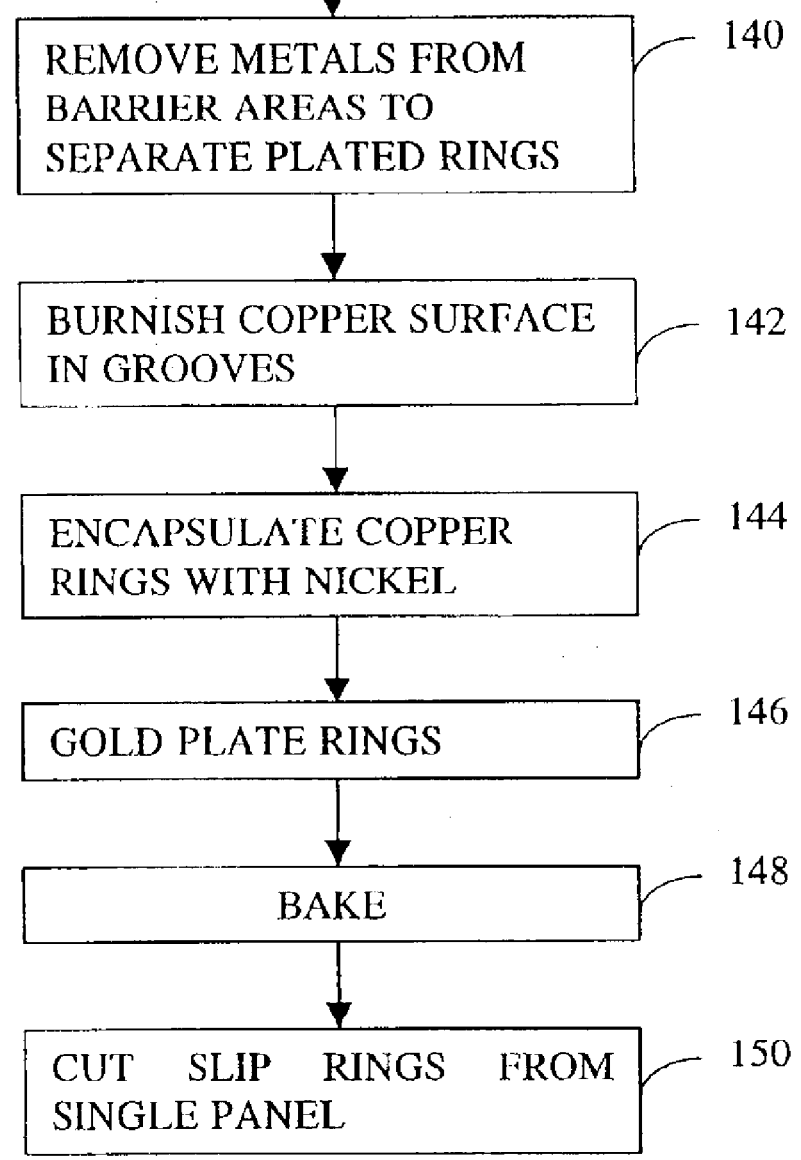

Various embodiments of the present invention are directed to a multilayer printed circuit board (PCB) platter slip ring and a method for manufacturing the slip ring. The method for manufacturing the slip ring, set forth herein, may start with the procurement of a first double clad copper laminate and a second double clad copper laminate. Each of the laminates is processed with blind via technology with vias from layers 1 and 2 of the first double clad copper laminate and other vias from layers 3 and 4 of the second double clad copper laminate. The holes are plated and the laminates are processed through a lamination cycle to yield a four layer PCB with filled blind vias. Copper on the outer layers (i.e., layers 1 and 4) is etched off in desired areas and a plurality of concentric grooves are machined into the dielectric to include the blind via hole locations. Full build plating is applied directly to the dielectric material (and the plated blind vias) to produce slip rings with peel strengths of four pounds per square inch (PSI) or greater, as detailed herein, to form electrical paths for the slip ring connections. After etching undesirable copper from the dielectric barriers and other areas, initial copper plating is then encapsulated with nickel and gold plating using a bus bar system for a single-point electrical connection in a manufacturing panel unit. Single product units are then routed out of the manufacturing panel eliminating the bus bar electrical connection system.

Thus, embodiments of the present invention provide a cost effective technique for producing a multilayer PCB platter slip ring with high density, tight mechanical tolerances, raised dielectric PCB material barriers between the conductive grooves and optional additional raised barriers using soldermask technology.

In general, embodiments of the present invention are directed to platter or pancake-type slip rings that have two or more layers. It should be appreciated that pancake-type slip rings may be utilized in a variety of military/commercial applications, such as infrared heat detectors, targeting systems, radar sweeps and radars, where a rotating electrical part is connected to stationary electrical part. Depending upon the groove profile and ring depth, pitches less than 40 mils can be readily achieved. According to the present invention, a variety of various shaped brush grooves are machined into a dielectric material of a printed circuit board (PCB) base material. In this manner, the remaining dielectric material provides a barrier between later-formed conductive rings of the slip ring. The machined grooves are then metalized to provide conductive trace rings, which, depending upon the depth and the profile of the groove, can provide a slip ring with high-density conductive rings. The depth of the grooves is limited only by the width of the dielectric material. A slip ring manufactured according to the present invention is achieved through metal plating of the conductive rings, which are formed directly on the PCB dielectric, while providing sufficient peel/bond strength to meet stringent product requirements with respect to the laminate copper peel parameters. For example, using the processes described herein, peel/bond strengths greater than four PSI can be achieved.

While the process, described herein, discloses electroplating, at least initially, the entire surface of a side of two dielectrics, it should be appreciated that dielectric barriers between ring grooves can be masked such that only the grooves are metalized in specific operations. It should also be appreciated that any deposited metals can be removed from the dielectric barriers through a mechanical abrasive scrub or a chemical process. According to another embodiment of the present invention, an electrical bus bar system, which includes an outside window of a PCB panel, allows all of the conductive trace rings of a slip ring to be plated using a single electrical connect point in the plating process without requiring additional wiring, thus, greatly simplifying the manufacturing process from previously known slip ring processes.

FIGS. 1A–1D illustrate a process flow diagram 100 for manufacturing an exemplary multilayer printed circuit board (PCB) slip ring according to an embodiment of the present invention. The process 100 depicted in FIGS. 1A–1D is directed to a method for manufacturing a multilayer PCB slip ring that utilizes a double clad copper laminate having a first side and a second side separated by a first dielectric and a second double clad copper laminate having a third side and a fourth side separated by a second dielectric. It should be appreciated that as the copper is completely removed from windows on one side of both of the double clad copper laminates, the process could be initiated with a laminate of an appropriate width having copper on only one side, if a bus bar for electroplating is not desired or if electroplating a bus bar outside of the window was desired. However, for manufacturing purposes, it is generally easier to produce PCBs with copper cladding on both sides of the laminate and providing a bus bar for electroplating is generally desirable.

It should also be appreciated that, if desired, a manufacturer may create their own double clad copper laminates (e.g., including a first ½ ounce sheet of copper, seven sheets of 1080, a 0.028 core, seven sheets of 1080 and a second ½ ounce sheet of copper) or purchase the double clad copper laminates as standard stock from various manufacturers of PCB panels. The process 100, as partially depicted in FIG. 1A, is initialized in step 102 by drilling holes for the vias into printed circuit board (PCB) panels (i.e., a PCB panel #1 and a PCB panel #2). As previously discussed, with respect to the process 100, the panels are double clad copper laminates. The vias may eventually take various forms such as blind vias, buried vias and, in general, the holes are plated through using a blind via process in at least the ring grooves, which are later formed in the dielectric material of the PCB panels #1 and #2.

Upon drilling the holes through the panels in step 102, the vias are metalized in step 104. It should be appreciated that the vias can be metalized using a number of processes. For example, one such process would be to chemically deposit a thin coating of metal such as palladium. It should also be appreciated that materials, such as electroless copper, may also be utilized. The metal in the vias are then later built-up through an electroplating process to apply a thicker coating of copper to achieve a desired current carrying capability. Next, in step 106, side 2 of PCB panel #1 and side 3 of PCB panel #2 are patterned using standard printed circuit board techniques. That is, a resist is applied to side 2 of PCB panel #1 and side 3 of PCB panel #2, at which point the resist is imaged and the copper cladding on side 2 of PCB panel #1 and side 3 of PCB panel #2 is then etched with an appropriate etchant to remove copper where it is not desired.

Then, in step 108, PCB panel #1 is bonded (e.g., using a first sheet of 106, a first sheet of 1080, a sheet of 7628, a second sheet of 1080 and a second sheet of 106) with PCB panel #2 to form a single panel. It should be appreciated that the dielectrics of the double clad copper laminate panels may take a variety of forms. For example, the dielectric may be an FR4 material, a polyimide material, a cyanate ester material or a byasamine tryaldimide material, to name a few common materials. It should also be appreciated that in step 108, when PCB panel #1 is bonded to PCB panel #2 to form a single unitary panel, epoxy/adhesive that is utilized to bond the panels flows up through the plated holes in PCB panel #1 and PCB panel #2 structurally supporting the copper of the vias. In this manner, if a groove is later cut into the vias, as exhibited in FIG. 5B, the epoxy inside the plated through holes structurally supports the copper eyelets preventing the copper from collapsing and being ripped away from the hole wall. Next, in step 110, a window is formed in sides 1 and 4 of the single unitary panel by removing the copper. Holes are then plated through in a manner similar to that discussed with respect to step 104. Thus, each panel is window framed with copper on layers 1 and 4 and the copper is removed within the window.

Next, in step 112, grooves are machined within the window into sides 1 and 4 of the single unitary panel to a desired depth and profile. It should be appreciated that new tooling holes may be drilled at this point such that the alignment of the grooves in the dielectric from side 1 and the grooves in the dielectric from side 4 are better registered with one another. It should also be appreciated that the grooves can be machined into the dielectrics using any number of computerized numerical controlled (CNC) devices, such as a CNC PCB router, lathe, etc. Next, in step 114, the single unitary panel is baked at a dielectric appropriate temperature above $T_G$ (e.g., at 360 degrees F. for 1.5 to 2.0 hours) for stress relief. Then, in step 116, the dielectric of sides 1 and 4 are conditioned through a PCB de-smear process, followed by an additional high alkaline process prior to metalization.

It is contemplated that a number of different high alkaline chemical baths may be utilized to condition the surface of the epoxy or dielectric after the de-smear process to make it receptive for receiving metalization. One such chemical bath is a solution of 15–25% by volume of 50% sodium hydroxide, 0.9–1.8% aliphatic carboxylic acid salt, 0.09–0.45% monoethanolamine and deionized water. Solution temperature may be about 135 degrees F. with a dwell time of 4 minutes, followed by a thorough rinse. The desmear process in this example is a PCB permanganate process, however, other de-smear processes may be utilized, such as a sulfuric acid desmear process and/or a plasma desmear process. A satisfactory alkaline bath can be achieved with a product known as Alchelate manufactured and made commercially available by Shipley.

Then, in step 118, sides 1 and 4 of the single unitary panel are metalized. One such process for metalizing the grooves of sides 1 and 4 of the single unitary panel may include a palladium deposition, followed by an electroless nickel deposition. Next, in step 120, the single unitary panel is baked (e.g., at a temperature of 260 degrees F. for 2 hours) to remove moisture and solvents. In a typical process, between 8 and 12 millionths of an inch of nickel is deposited over the palladium. Next, in step 122, the nickel surface of sides 1 and 4 is reactivated. Then, in step 124, the copper plating of the metalized surface is initiated at a relatively low plating current, such as 10 amps per square foot (ASF) or less. Next, in step 126, the single unitary panel is baked for 3–4 hours at 250 degrees F. for stress relief and adhesion promotion. Then, in step 128, the oxidation resulting from baking the single unitary unit is removed from the copper plated surface.

Next, in step 130, the barrier areas between the rings that are being formed are masked to prevent further copper build-up in the barrier areas. Then, in step 132, the grooves in sides 1 and 4 are copper plated. Next, in step 134, the single unitary panel is baked and, in step 136, the oxidation that forms on the copper plating, as a result of the baking, is removed. Then, in step 138, it is determined whether the copper plating is a desired thickness or depth. If so, control transfers to step 140. Otherwise, control transfers to step 128 where steps 128, 130, 132, 134 and 136 are repeated to further increase the thickness of the copper plating. In step 140, the thin metals (i.e., the palladium, nickel and copper) are removed from the barrier areas to separate the plated rings. One method for thin metal removal is submersion of copper in a copper microetch and a nickel stripper to remove the barrier plate, as well as a small insignificant amount of the thicker groove copper and followed by a permanganate desmear process. Next, in step 142, the surface of the copper in the grooves is burnished to smooth out the copper surface and microetched to remove small burrs.

Then, in step 144, the copper rings are encapsulated with nickel. Next, in step 146, a gold plating is applied over the nickel. Then, in step 148, the single unitary unit is baked. At this step, an optional raised barrier can be formed on the existing dielectric barriers using a single or multiple soldermask process steps. Finally, in step 150, the slip rings are cut from the single panel to produce a final product.

Accordingly, a number of process steps have been described herein, which provide a four layer PCB slip ring that exhibits peel strengths in excess of four pounds per square inch (PSI), per IPC PCB industry test methods, while dramatically reducing the cost of the slip ring with respect to those currently commercially available. It should be appreciated that the processes, described herein, are directly applicable to slip rings using various multilayer design parameters. One difference between a slip ring manufactured according to the present invention and those described in the prior art is that those described in the prior art utilize a copper laminated to a dielectric (as purchased from a manufacturer) and then plate onto the laminated copper, relying upon the peel strength provided by the original dielectric copper bond. In contrast, the technique, described herein, removes laminated copper from a window on the outer layers, grooves the dielectric and metalizes the grooves in the dielectric, while still achieving satisfactory peel strengths for a wide variety of applications.

Figure 2:
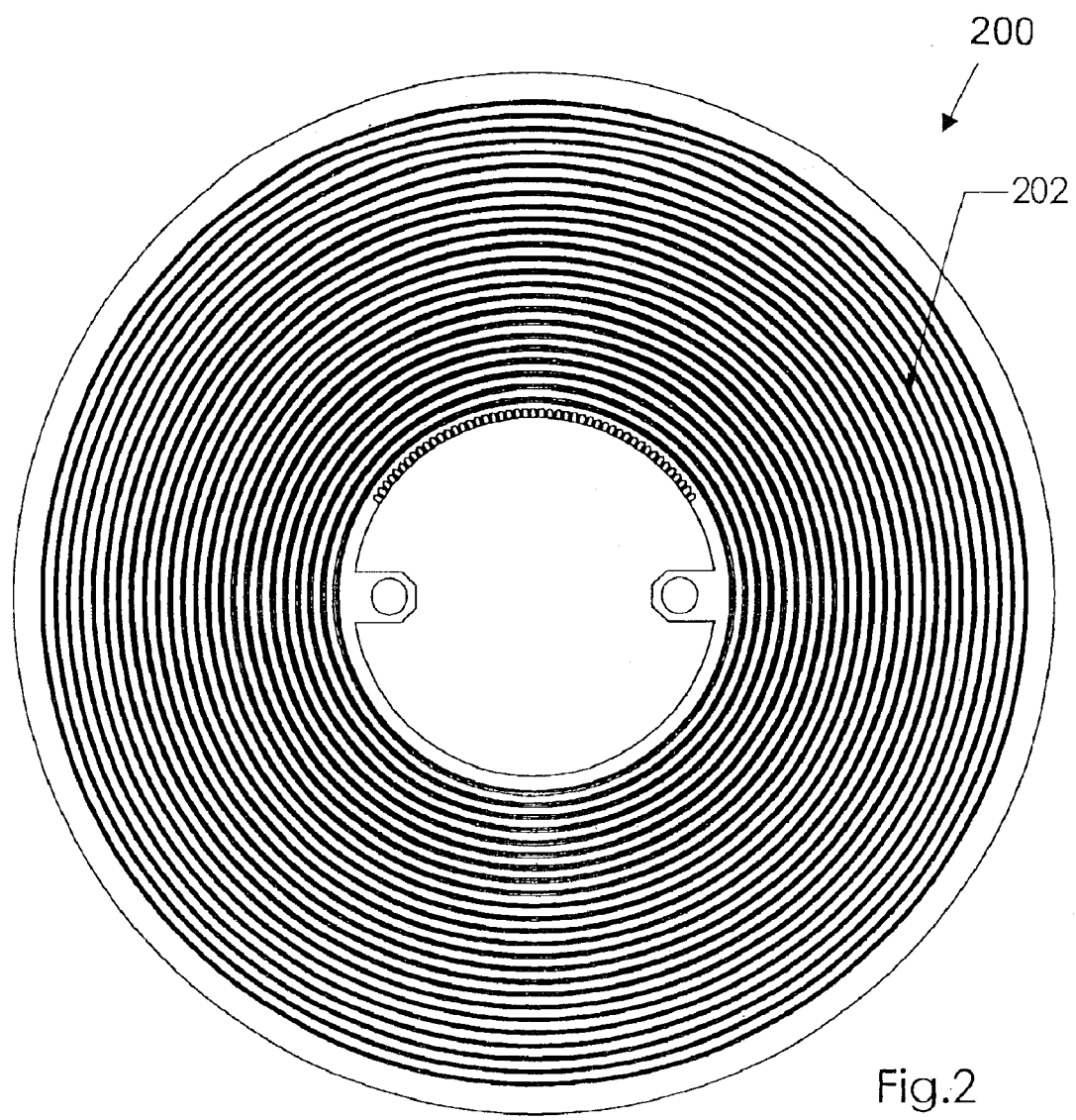
FIG. 2 is a front view of an exemplary multi-layer printed circuit board (PCB) with slip ring grooves formed on opposite sides of the multi-layer PCB, according to one embodiment of the present invention.
Figure 3A:
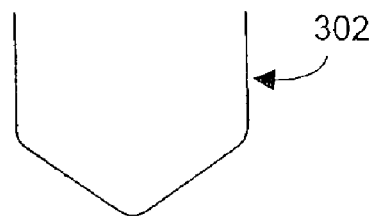
FIGS. 3A–3C are various slip ring groove profiles that may be implemented in the multi-layer PCB of FIG. 2, according to various embodiments of the present invention.
Figure 3B:
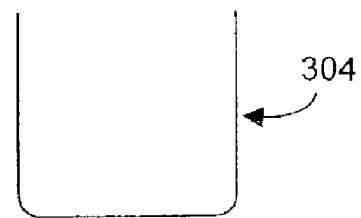
Figure 3C:
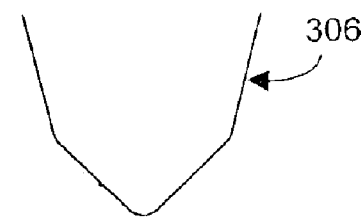

FIG. 2 is a front view of an exemplary multi-layer printed circuit board (PCB) 200 with slip ring grooves 202 formed on opposite sides of the multi-layer PCB 200. The slip ring grooves 202 may have various profiles, such as the profiles 302, 304 and 306 shown in FIG. 3A, FIG. 3B and FIG. 3C, respectively. Further, profiles other than those shown in FIGS. 3A–3C may be implemented according to the present invention. FIG. 4A depicts a partial cross-sectional view of an exemplary double clad copper laminate 400 that includes a dielectric 402 with a first copper foil 404 attached to the dielectric 402 on a first side and a second copper foil 406 attached to the dielectric 402 on a second side. FIG. 4B depicts a partial cross-sectional view of the double clad copper laminate 400 of FIG. 4A including a hole 410 drilled therein. FIG. 4C depicts a partial cross-sectional view of the double clad copper laminate 400 of FIG. 4B with the hole 410 including plating 408. As previously discussed, the plating 408 may include a layer of palladium and one or more layers of copper that have been applied through a copper electroplating process.

Figure 5A:
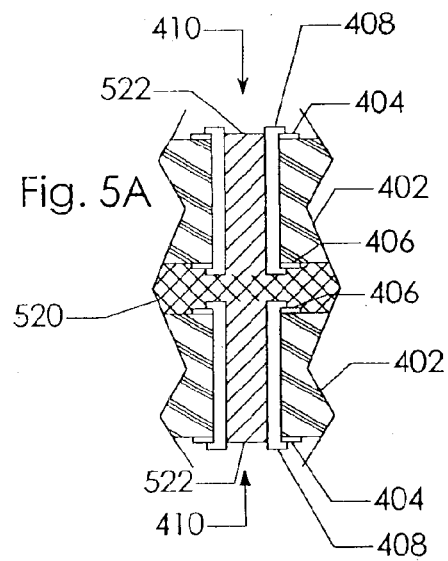
FIG. 5A is a partial cross-sectional view of two double clad copper laminates joined by a glass supported resin, according to another embodiment of the present invention.
Figure 5B:
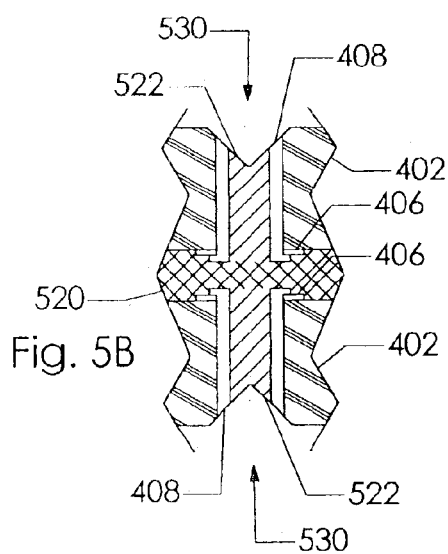
FIG. 5B is a partial cross-sectional view of machined grooves formed in the dielectrics of the laminates of FIG. 5A, according to an embodiment of the present invention.
Figure 5C:
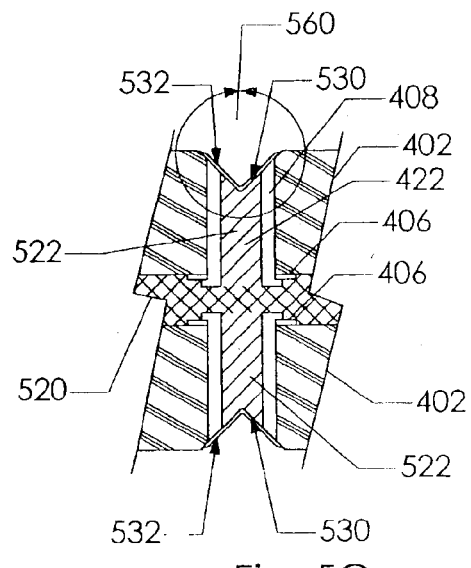
FIG. 5C is a partial cross-sectional view of the grooves of FIG. 5B plated, according to one embodiment of the present invention.
Figure 5D:
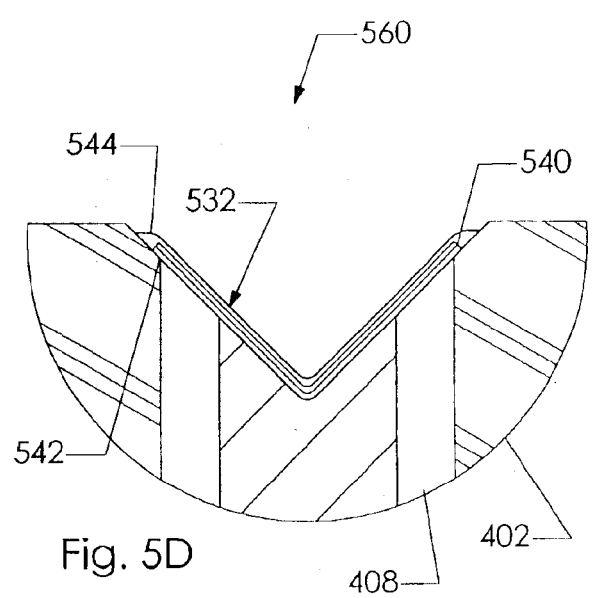
FIG. 5D is a partial cross-sectional view further detailing the plating of FIG. 5C.

With reference to FIG. 5A, two double clad copper laminates 400 are shown joined by a glass supported resin 520. It should be noted that a portion 522 of the resin 520 is pushed into the holes 410, during the process of bonding the two double clad copper laminates 400. The resin 522 advantageously supports the plating 408 during the grooving step as shown in FIG. 5B, when the holes 410 are co-located with one of the grooves 402. With reference to FIG. 5B, machined grooves 530 are formed into the dielectric 402 and the resin 522. As is shown in FIG. 5C, the grooves 530 are plated with a groove plating 532 that is electrically connected to the plating 408. It should be noted that FIG. 5C shows copper plating in the groove area after the copper foil 404 has been removed. As is shown in FIG. 5C, the plating 532 is also connected to a portion of the copper foil 406. With reference to FIG. 5D, an area 560, which further depicts the plating 532, includes a nickel layer 542 formed on a palladium layer (not shown). One or more copper layers 540 are formed on the nickel layer 542. A second nickel layer 544 is formed over the one or more copper layers 540, with a gold layer (not shown individually) formed on the second nickel layer 542. After barrier plating removal, the second nickel layer 542 encapsulates the one or more copper layers 540 and provides a barrier layer between the copper and gold layer to prevent migration of the gold.

Figure 6A:
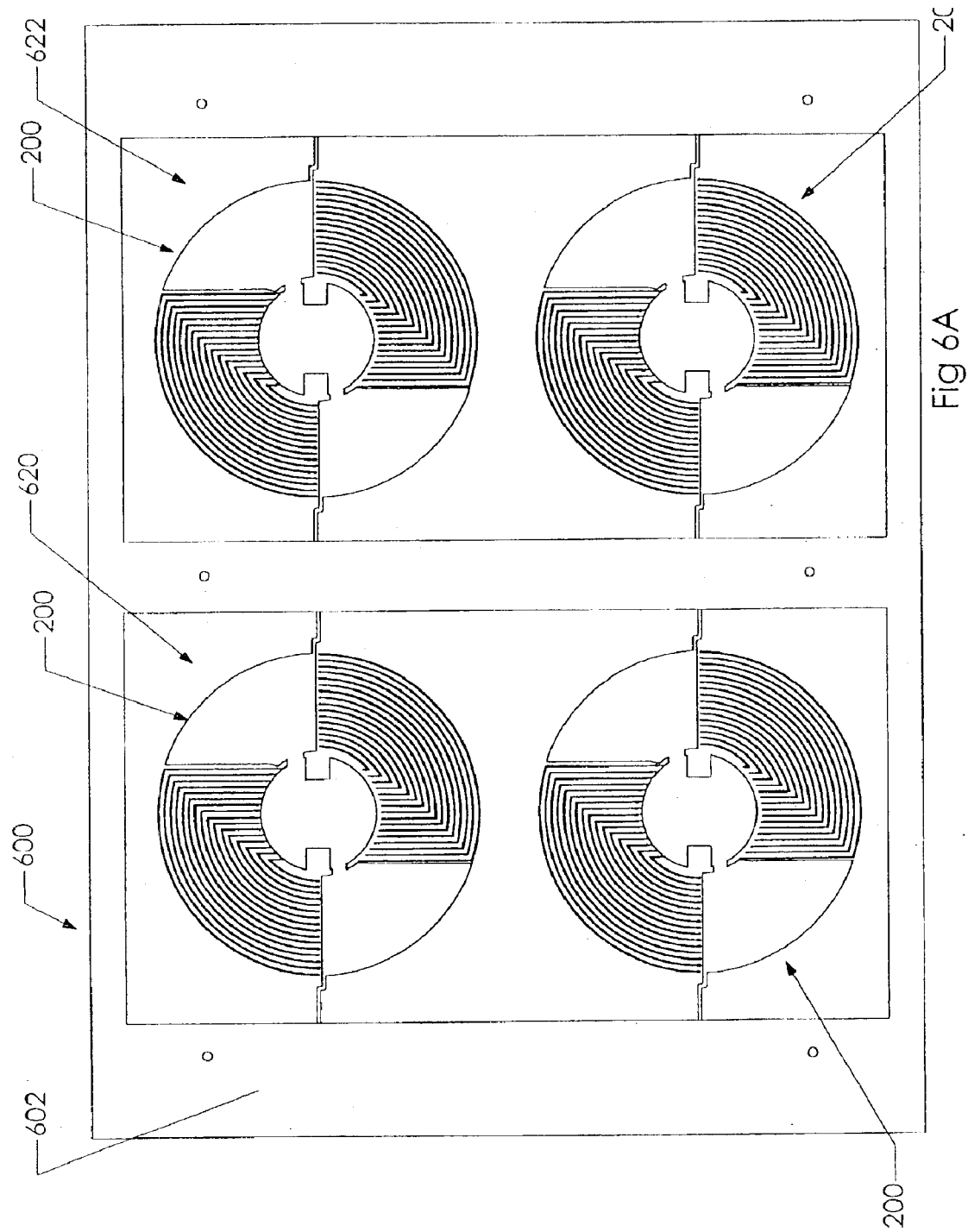
FIG. 6A is a front view of a panel that includes four multi-layer PCBs, according to an embodiment of the present invention.
Figure 6B:
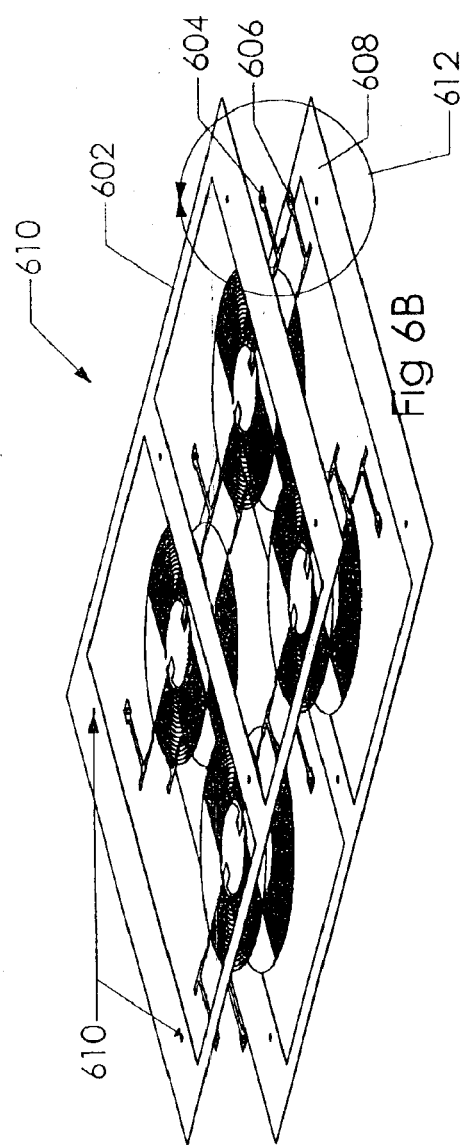
FIG. 6B is an exploded view of window frames and internal circuit traces of the panel of FIG. 6A, where the internal circuit traces are attached to the metalized grooves and the window frames for electroplating of the grooves, according to another embodiment of the present invention.
Figure 6C:
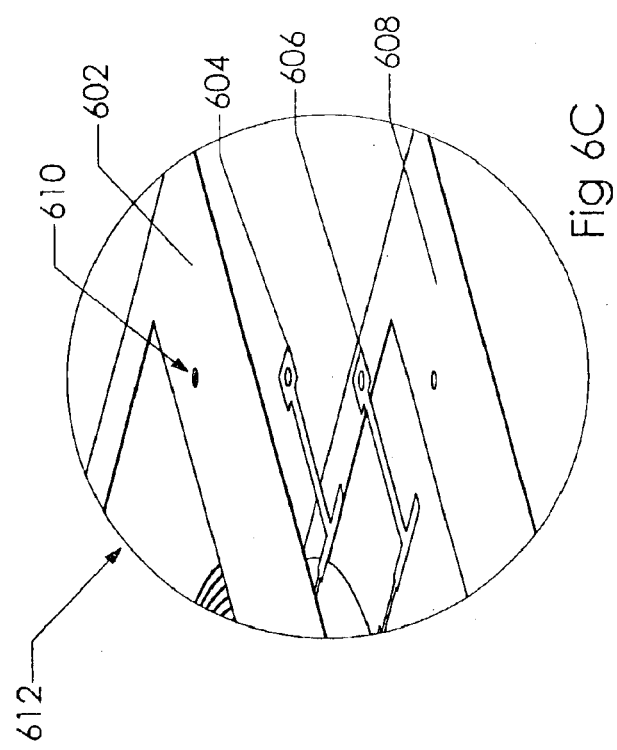
FIG. 6C is a partial exploded view of FIG. 6B further illustrating the interconnection of the internal circuit traces to the window frames.
Figure 6D:
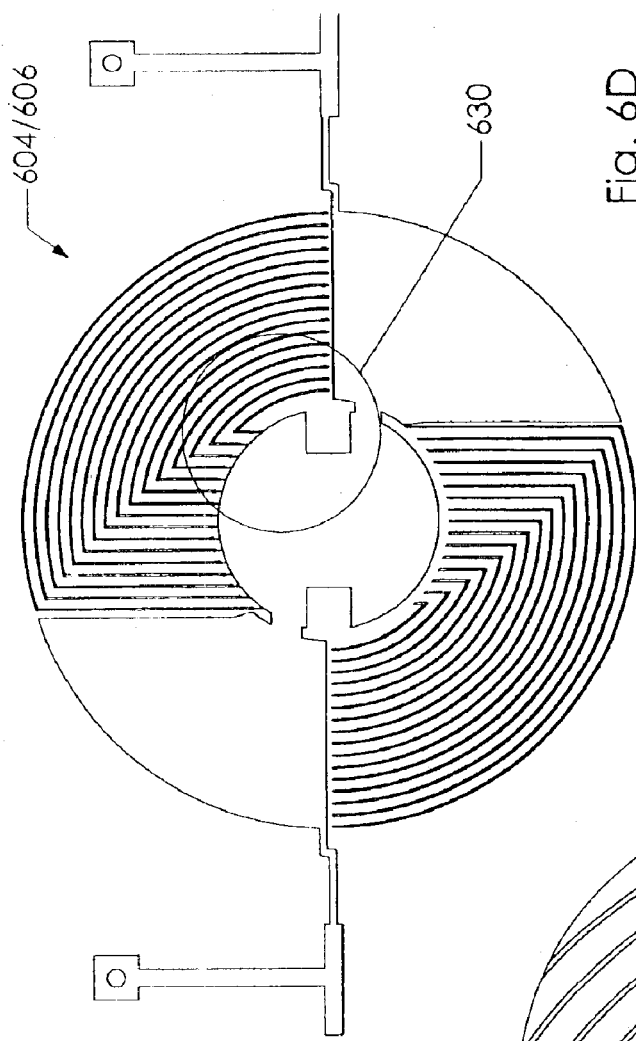
FIG. 6D is a front view of one of the multi-layer PCBs of FIG. 6A which further depicts the interconnection of the circuit traces, according to yet another embodiment of the present invention.
Figure 6E:
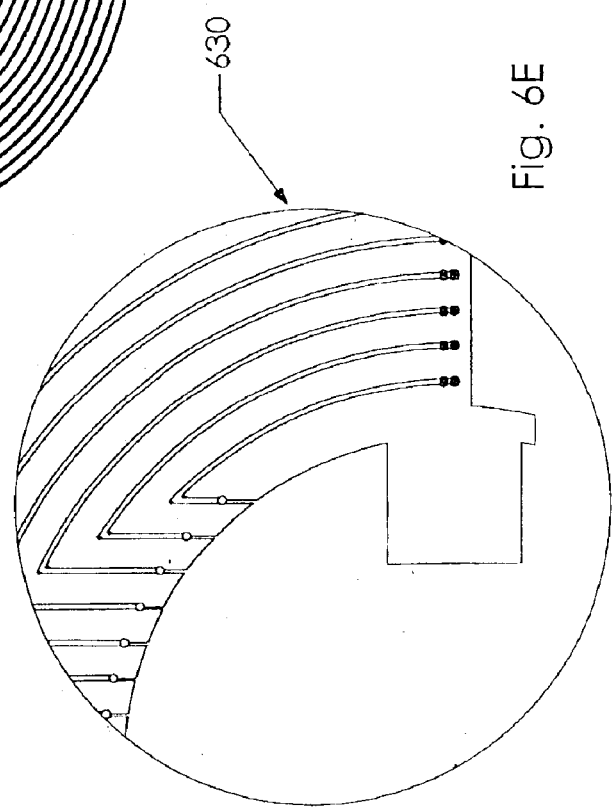
FIG. 6E is a partial front view of the interconnection of the circuit traces of FIG. 6D.

FIG. 6A depicts a portion of an inner layer of a four-layer PCB panel 600 that includes four multi-layer PCBs 200, formed within windows 620 and 622, through a window frame of copper 602, which is utilized as a bus for electroplating the grooves 402. It should be appreciated that the grooved dielectric is not shown within the windows 620 and 622. As is better shown in FIG. 6B, the window frames of copper 602 and 608, which are formed in the original copper foil 404, are utilized to connect the metalized grooves formed in the outer surfaces of the multi-layer PCBs 200 to allow for further electroplating 532, e.g., electroplating of copper, in the grooves 530. The outer layer window frames of copper 602 and 608 are connected to inner layer copper buses 604 and 606, through plated through holes 610. FIG. 6D shows the configuration of the layers 604/606 for one of the PCBs 200. FIG. 6E shows area 630, of FIG. 6D, in greater detail with inner layer traces and via hole electrical connections to the outer layer grove areas.

Figure 7:
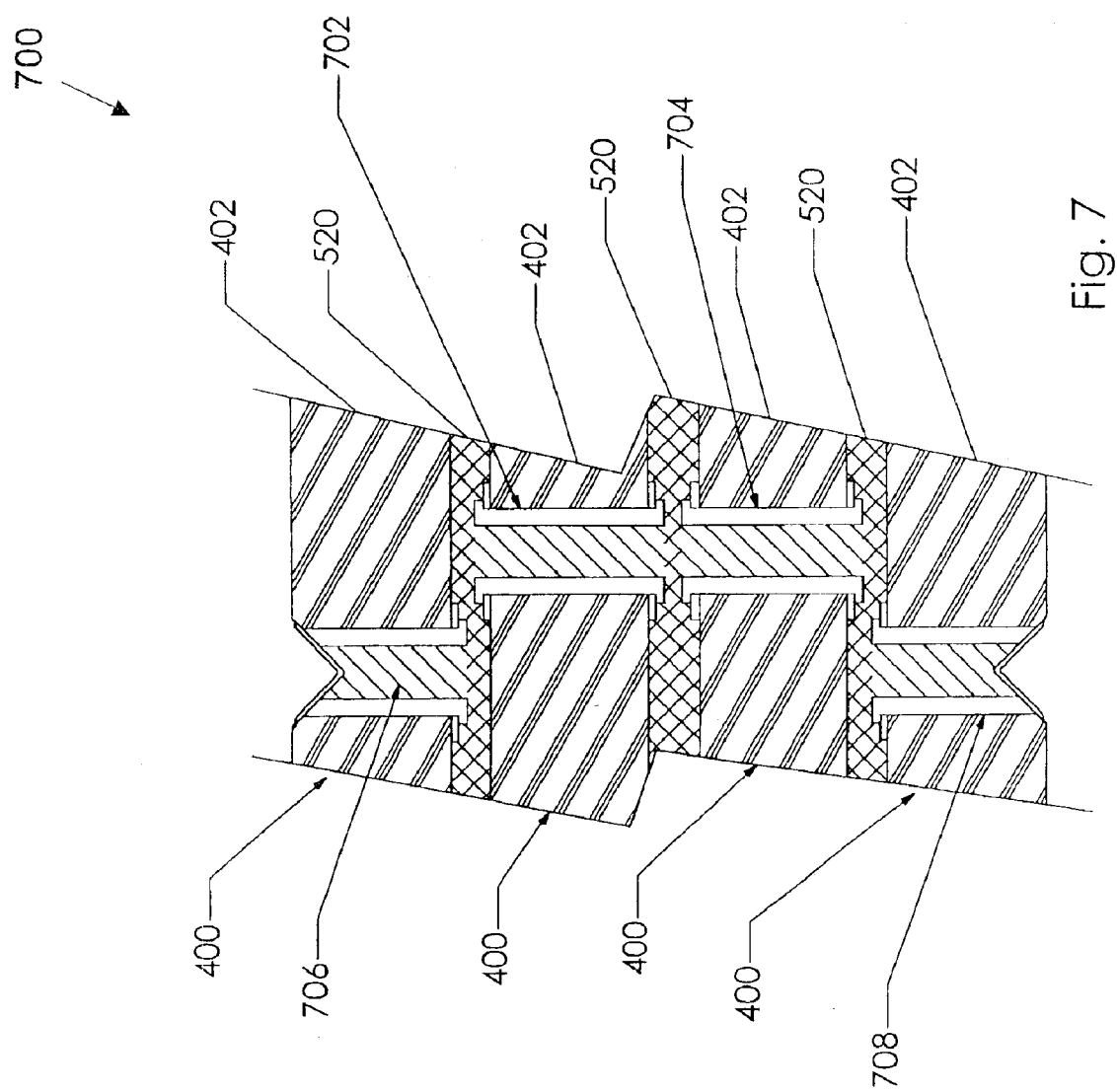
FIG. 7 is a partial cross-sectional view of four double clad copper laminates illustrating buried and blind vias, according to another embodiment of the present invention.

FIG. 7 depicts a partial cross-section of four double clad copper laminates 400, which have been interconnected using a glass supported resin 520 to form an eight layer PCB 700. As is shown in FIG. 7, two buried vias 702 and 704 and two blind vias 706 and 708 are formed in the PCB 700.

Accordingly, a number of slip rings have been described herein which generally use multiple double clad copper laminates to form layers of the slip ring. It should be appreciated that the above described processes are also applicable to slip rings with grooves on only one side.

The above description is considered that of the preferred embodiments only. Modifications of the invention will occur to those skilled in the art and to those who make or use the invention. Therefore, it is understood that the embodiment(s) shown in the drawings and described above are merely for illustrative purposes and not intended to limit the scope of the invention, which is defined by the following claims as interpreted according to the principles of patent law, including the doctrine of equivalents.

What is claimed is:

1. A method for manufacturing a slip ring, comprising the steps of:
    providing a first double clad copper laminate having a first side and a second side separated by a first dielectric;
    providing a second double clad copper laminate having a third side and a fourth side separated by a second dielectric;
    selectively removing the copper on the second and third sides to provide desired patterns in the copper;
    joining the second and third sides in a desired orientation;
    removing substantially all of the copper from a window in the first and fourth sides to expose the first and second dielectrics;
    machining a plurality of concentric grooves within the window and into the first and second dielectrics from the first and fourth sides; and
    metalizing the concentric grooves to provide a plurality of concentric metalized rings.

2. The method of claim 1, further including the steps of:
    providing at least one ring hole in each of the concentric grooves;
    providing a plurality of interconnecting holes to selectively interconnect portions of the patterns formed on the second surface and the third surface;
    plating the at least one ring hole in each of the concentric grooves and the plurality of interconnecting holes; and
    filling the at least one plated ring hole with a dielectric during the step of joining the second and third sides.

3. The method of claim 1, wherein the step of metalizing the concentric grooves to provide the plurality of concentric metalized rings further includes the steps of:
    conditioning the exposed surfaces of the first and second dielectrics;
    depositing a layer of palladium on the first and second dielectrics;
    depositing a first layer of nickel over the layer of palladium;
    depositing at least one layer of copper over the first layer of nickel;
    depositing a second layer of nickel over the at least one layer of copper to fully encapsulate the at least one layer of copper; and
    depositing a layer of gold over the second layer of nickel.

4. The method of claim 3, wherein the step of conditioning the exposed surfaces of the first and second dielectrics includes the steps of:
    performing a desmear process on the exposed surfaces of the first and second dielectrics;
    subjecting the exposed surfaces of the first and second dielectrics to an alkaline bath; and
    rinsing the exposed surfaces of the first and second dielectrics after the alkaline bath.

5. The method of claim 4, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

6. The method of claim 1, wherein the copper outside of the window is electrically connected to each of the plurality of concentric metalized rings and functions as a plating bus.

7. A method for manufacturing a slip ring, comprising the steps of:
    providing a first single clad copper laminate having a first dielectric on a first side and a first copper sheet on a second side;
    providing a second single clad copper laminate having a second copper sheet on a third side and a second dielectric on a fourth side;
    selectively removing the copper on the second and third sides to provide desired patterns in the copper;
    joining the second and third sides in a desired orientation;
    machining a plurality of concentric grooves within a window and into the first and second dielectrics from the first and fourth sides; and
    metalizing the concentric grooves to provide a plurality of concentric metalized rings.

8. The method of claim 7, further including the steps of:
    providing at least one ring hole in each of the concentric grooves;
    providing a plurality of interconnecting holes to selectively interconnect portions of the patterns formed on the second surface and the third surface;
    plating the at least one ring hole in each of the concentric grooves and the plurality of interconnecting holes; and
    filling the at least one plated ring hole with a dielectric during the step of joining the second and third sides.

9. The method of claim 7, wherein the step of metalizing the concentric grooves to provide the plurality of concentric metalized rings further includes the steps of:
    conditioning the exposed surfaces of the first and second dielectrics;
    depositing a layer of palladium on the first and second dielectrics;
    depositing a first layer of nickel over the layer of palladium;
    depositing at least one layer of copper over the first layer of nickel;
    depositing a second layer of nickel on the at least one layer of copper to fully encapsulate the at least one layer of copper; and
    depositing a layer of gold over the second layer of nickel.

10. The method of claim 9, wherein the step of conditioning the exposed surfaces of the first and second dielectrics includes the steps of:
    performing a desmear process on the exposed surfaces of the first and second dielectrics;
    subjecting the exposed surfaces of the first and second dielectrics to an alkaline bath; and
    rinsing the exposed surfaces of the first and second dielectrics after the alkaline bath.

11. The method of claim 10, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

12. The method of claim 7, wherein a copper layer formed outside of the window is electrically connected to each of the plurality of concentric metalized rings and functions as a plating bus.

13. A slip ring, comprising:
a first single clad copper laminate having a first dielectric on a first side and a first copper sheet on a second side; and
a second single clad copper laminate having a second copper sheet on a third side and a second dielectric on a fourth side, wherein the copper on the second and third sides is selectively removed to provide desired patterns in the copper, and wherein the second and third sides are joined in a desired orientation, where a plurality of concentric grooves are machined into the first and second dielectrics from the first and fourth sides, and where the concentric grooves are metalized to provide a plurality of concentric metalized rings.

14. The slip ring of claim 13, wherein at least one ring hole is provided in each of the concentric grooves and a plurality of interconnecting holes is provided to selectively interconnect portions of the patterns formed on the second surface and the third surface, and wherein the at least one ring hole in each of the concentric grooves and the plurality of interconnecting holes are plated and the at least one plated ring hole is filled with a dielectric when the second and third sides are joined.

15. The slip ring of claim 13, wherein the concentric grooves are metalized by conditioning the exposed surfaces of the first and second dielectrics, depositing a layer of palladium on the first and second dielectrics, depositing a first layer of nickel over the layer of palladium, depositing at least one layer of copper over the first layer of nickel, depositing a second layer of nickel over the at least one layer of copper to fully encapsulate the at least one layer of copper and depositing a layer of gold over the second layer of nickel.

16. The slip ring of claim 15, wherein the exposed surfaces of the first and second dielectrics are conditioned by performing a desmear process on the exposed surfaces of the first and second dielectrics, subjecting the exposed surfaces of the first and second dielectrics to an alkaline bath and rinsing the exposed surfaces of the first and second dielectrics after the alkaline bath.

17. The slip ring of claim 16, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

18. A slip ring, comprising:
a first single clad copper laminate having a first dielectric on a first side and a first copper sheet on a second side; and
a second single clad copper laminate having a second copper sheet on a third side and a second dielectric on a fourth side, wherein the copper on the second and third sides is selectively removed to provide desired patterns in the copper, and wherein the second and third sides are joined in a desired orientation, where a plurality of concentric grooves are machined into the first and second dielectrics from the first and fourth sides, and where the concentric grooves are metalized to provide a plurality of concentric metalized rings that have a peel strength greater than about four pounds per square inch (PSI).

19. The slip ring of claim 18, wherein at least one ring hole is provided in each of the concentric grooves and a plurality of interconnecting holes is provided to selectively interconnect portions of the patterns formed on the second surface and the third surface, and wherein the at least one ring hole in each of the concentric grooves and the plurality of interconnecting holes are plated and the at least one plated ring hole is filled with a dielectric when the second and third sides are joined in a desired orientation.

20. The slip ring of claim 18, wherein the concentric grooves are metalized by conditioning the exposed surfaces of the first and second dielectrics, depositing a layer of palladium on the first and second dielectrics, depositing a first layer of nickel over the layer of palladium, depositing at least one layer of copper over the first layer of nickel, depositing a second layer of nickel over the at least one layer of copper to fully encapsulate the at least one layer of copper and depositing a layer of gold over the second layer of nickel.

21. The slip ring of claim 20, wherein the exposed surfaces of the first and second dielectrics are conditioned by performing a desmear process on the exposed surfaces of the first and second dielectrics, subjecting the exposed surfaces of the first and second dielectrics to an alkaline bath and rinsing the exposed surfaces of the first and second dielectrics after the alkaline bath.

22. The slip ring of claim 21, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

23. A method for manufacturing a slip ring, comprising the steps of:
providing a first double clad copper laminate having a first side and a second side separated by a first dielectric;
selectively removing the copper on the second side to provide desired patterns in the copper;
removing substantially all of the copper from a window in the first side to expose the first dielectric;
machining a plurality of concentric grooves within the window and into the first dielectric from the first side; and
metalizing the concentric grooves to provide a plurality of concentric metalized rings.

24. The method of claim 23, further including the steps of:
providing at least one ring hole in each of the concentric grooves;
providing a plurality of interconnecting holes to selectively interconnect portions of the patterns formed on the second surface;
plating the at least one ring hole in each of the concentric grooves and the plurality of interconnecting holes; and
filling the at least one plated ring hole with a dielectric.

25. The method of claim 23, wherein the step of metalizing the concentric grooves to provide the plurality of concentric metalized rings further includes the steps of:
conditioning the exposed surfaces of the first dielectric;
depositing a layer of palladium on the first dielectric;
depositing a first layer of nickel over the layer of palladium;
depositing at least one layer of copper over the first layer of nickel;

depositing a second layer of nickel over the at least one layer of copper to fully encapsulate the at least one layer of copper; and depositing a layer of gold over the second layer of nickel.

26. The method of claim 25, wherein the step of conditioning the exposed surfaces of the first dielectric includes the steps of:

performing a desmear process on the exposed surfaces of the first dielectric;

subjecting the exposed surfaces of the first dielectric to an alkaline bath; and rinsing the exposed surfaces of the first dielectric after the alkaline bath.

27. The method of claim 26, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

28. The method of claim 23, wherein the copper outside of the window is electrically connected to each of the plurality of concentric metalized rings and functions as a plating bus.

29. A slip ring, comprising:

a first single clad copper laminate having a first dielectric on a first side and a first copper sheet on a second side, wherein the copper sheet on the second side is selectively removed to provide desired patterns in the copper sheet, and wherein a plurality of concentric grooves are machined into the first dielectric from the first side, where the concentric grooves are metalized to provide a plurality of concentric metalized rings.

30. The slip ring of claim 29, wherein at least one ring hole is provided in each of the concentric grooves and a plurality of interconnecting holes is provided to selectively interconnect portions of the patterns formed on the second surface, and wherein the at least one ring hole in each of the concentric grooves and the plurality of interconnecting holes are plated and the at least one plated ring hole is filled with a dielectric.

31. The slip ring of claim 29, wherein the concentric grooves are metalized by conditioning the exposed surfaces of the first dielectric, depositing a layer of palladium on the first dielectric, depositing a first layer of nickel over the layer of palladium, depositing at least one layer of copper over the first layer of nickel, depositing a second layer of nickel over the at least one layer of copper to fully encapsulate the at least one layer of copper and depositing a layer of gold over the second layer of nickel.

32. The slip ring of claim 31, wherein the exposed surfaces of the first dielectric are conditioned by performing a desmear process on the exposed surfaces of the first dielectric, subjecting the exposed surfaces of the first dielectric to an alkaline bath and rinsing the exposed surfaces of the first dielectric after the alkaline bath.

33. The slip ring of claim 32, wherein the alkaline bath is a solution of 15 to 25 percent by volume of fifty percent sodium hydroxide, 0.9 to 1.8 percent aliphatic carboxylic acid salt, 0.09 to 0.45 percent monoethanolamine and deionized water.

* * * * *